United States Patent [19]

Johnson

[11] 4,248,346
[45] Feb. 3, 1981

[54] SHIPPING CONTAINER FOR SEMICONDUCTOR SUBSTRATE WAFERS

[75] Inventor: Douglas M. Johnson, Waconia, Minn.

[73] Assignee: Fluoroware, Inc., Chaska, Minn.

[21] Appl. No.: 7,300

[22] Filed: Jan. 29, 1979

[51] Int. Cl.³ .............................................. B65D 85/48
[52] U.S. Cl. .................................. 206/334; 206/454; 206/587; 206/586; 220/324
[58] Field of Search ............... 206/334, 454, 458, 586, 206/456, 587, 593; 220/324, 326

[56]  References Cited
U.S. PATENT DOCUMENTS

| | | | |
|---|---|---|---|
| 2,735,542 | 2/1956 | Shnitzler | 220/324 |
| 3,214,055 | 10/1965 | Schmidt | 220/326 |
| 3,410,391 | 11/1968 | Kanter | 220/324 X |
| 3,465,467 | 9/1969 | Allen | 220/326 |
| 4,043,451 | 8/1977 | Johson | 206/334 |
| 4,091,919 | 5/1978 | MacLeod et al. | 206/334 |
| 4,171,740 | 10/1979 | Clement et al. | 206/454 |

FOREIGN PATENT DOCUMENTS 1122282  1/1962  Fed. Rep. of Germany ........... 206/456

OTHER PUBLICATIONS

IBM Technical Bulletin, vol. 16, No. 7, 12/1973, Brenneman et al.

Primary Examiner—Joseph Man-Fu Moy
Attorney, Agent, or Firm—H. Dale Palmatier

[57]  ABSTRACT

A shipping container for semiconductor substrate wafers including a rectangular receptacle having a plurality of outwardly extending aligned and opposing vertical rib members which are spaced on the interior opposing sides of the receptacle, and interchangeable upper and lower cover members having finger and post structure to support and space each of the wafers. The upper and lower cover members engage with the outer sides of the receptacle. The receptacle includes latching crossbars across offset ends of each side of the receptacle which engage with locking members extending from each end of the upper and lower cover members. The upper and lower cover members include a plurality of opposing fingers spaced the longitudinal distance of the covers which support the wafer at arcuate points on the wafer and a plurality of posts spaced in between the opposing fingers along the longitudinal distance of the covers which provide separation between each of the wafers. In another embodiment, a pair of longitudinal extending opposing ribs run the longitudinal length of the receptacle which provide support for the wafers when the lower cover is removed. In a further embodiment, the upper and lower covers are provided with upward and outwardly extending ribs in lieu of the fingers and posts which provide support and separation of the wafers and align with the ribs of the receptacle.

4 Claims, 6 Drawing Figures

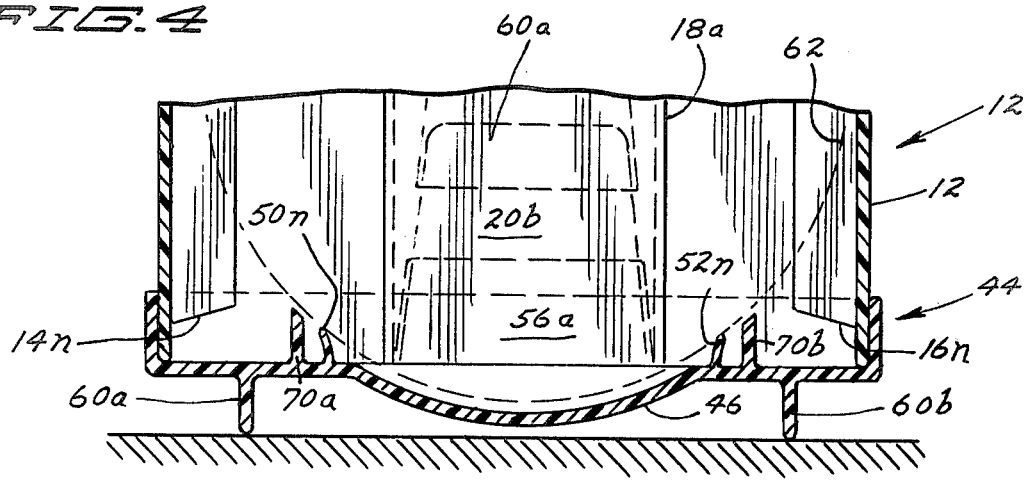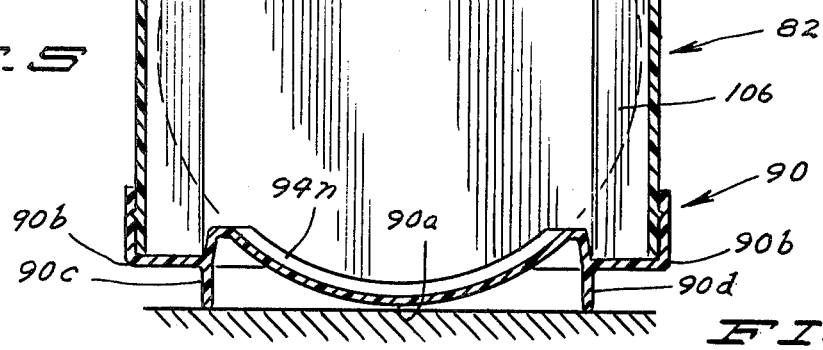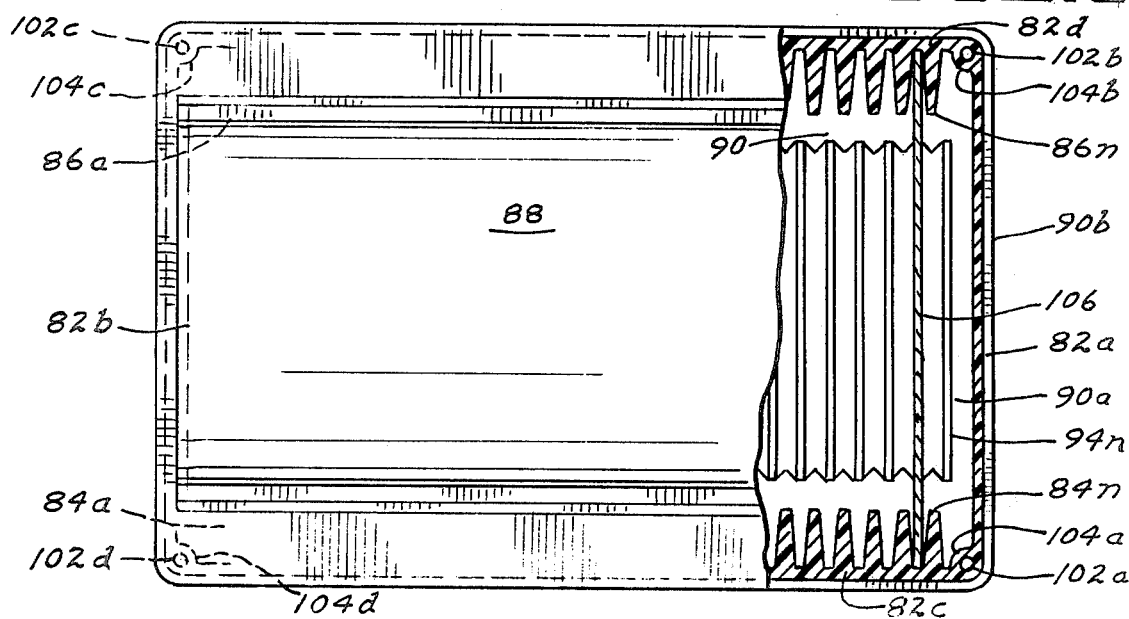

SHIPPING CONTAINER FOR SEMICONDUCTOR SUBSTRATE WAFERS

CROSS REFERENCES TO COPENDING APPLICATIONS

None

BACKGROUND OF THE INVENTION

1. Field of the Invention

The present invention relates generally to shipping containers, and more particularly, pertains to a shipping container for semiconductor substrate wafers and the like.

2. Description of the Prior Art

In the field of semiconductor substrate wafers, it has been a general practice to employ containers to store and ship the substrate wafers. Most prior art containers have been unsatisfactory in that the containers fail to protect the wafers against contamination from the environment, and handling damage during storage and shipping.

Rigid working wafers of semiconductor substrate material such as silicon are used extensively in the production of integrated circuits. Integrated circuit patterns are deposited and etched onto the substrate wafers in a number of steps of a process. The completion of the integrated circuit requires multistep procedures, and accordingly, the substrate wafers must be handled and are oftentimes shipped from one plant to another during the processing of the integrated circuits. Since the substrate wafers are rather large in dimension and of a rather small thickness, the likelihood of breakage of the substrate wafers is especially high during shipping. The wafers can be in the range of one and one-half to four inches in diameter and can be in the range of fifteen to fifty thousandths of an inch in thickness.

During transporting such as by common carrier and the like, the shipping container must protect the brittle, delicate substrate wafers against shipping damage and also against environmental contamination such as from dust, dirt, moisture, and the like.

The prior art shipping containers previously known and utilized have not been totally satisfactory for the purpose of retaining and cushioning the substrate wafers confined in the shipping container in addition to protecting the substrate wafers from environmental contamination. Also, the prior art shipping containers have had numerous sharp edges and have not easily lended themselves to heat shrinkable plastic bag sealing. The prior art containers have cut and shredded the plastic bags with the sharp edges of the container resulting in a shipping container which not only shredded the plastic bag seal covering of the package but also tended to lacerate the individual's hands handling the container.

The present invention overcomes the shortcomings of the prior art shipping containers by providing a shipping container for semiconductor substrate wafers.

SUMMARY OF THE INVENTION

The general purpose of this invention is to provide a shipping container for semiconductor substrate wafers which not only protects the substrate wafers during handling and shipping but also protects the substrate wafers from environmental contamination.

According to one embodiment of the preferred invention, there is provided a shipping container for semiconductor substrate wafers including an elongated rectangular receptacle having a plurality of outwardly extending opposing and aligned vertical ribs spaced along longitudinal elongated sidewalls of the receptacle, crossbar latching members for upper and lower cover members extending across offset ends of the elongated receptacle, and interchangeable upper and lower cover members for the top and bottom of the elongated receptacle, each cover member having a plurality of opposing fingers longitudinally spaced on a longitudinal arcuate portion of the member which support the wafers and a plurality of posts in between the fingers which separate the wafers, the fingers being in alignment with valleys of the ribs of the receptacle and the posts being in alignment with peaks of the ribs of the receptacles, an angular locking member affixed around the longitudinal arcuate portion which frictionally engages with the elongated receptacle and outwardly extending locking members having a tapered locking tooth from each end of the cover which engages up and over the respective crossbar latching member of each end of the receptacle whereby the fingers support the semiconductor wafers and the ribs and posts space and separate the semiconductor wafers in the shipping container while the crossbar and latching member including the tapered tooth which lock the cover members to the receptacle of the shipping container.

One significant aspect and feature of the present invention is a shipping container which not only protects the substrate wafers during handling and shipping, but also protects the substrate wafers against environmental contamination. A heat shrinkable plastic bag package can be formed around and about the shipping container and subsequently purged with an inert gas such as nitrogen which provides against environmental contamination of the substrate wafers.

Another significant aspect and feature of the present invention is to provide a shipping container which is reusable. The shipping container can be cleaned by a manufacturer or processor, and reused after cleaning. Cleaning by the manufacturer is facilitated by easy disassembly of the upper and lower cover members from the rectangular receptacle.

Having briefly described one embodiment of the present invention, it is a principal object hereof to provide a shipping container for semiconductor substrate wafers.

An object of the present invention is to provide a shipping container for semiconductor substrate wafers such as silicon substrates which cushions the wafers positioned in the shipping container during handling and shipping, and also protects the substrate wafers from environmental contamination. The shipping container absorbs shocks so that the wafers will not break or shatter, and protects the wafers from dust, moisture, and other environmental contaminants.

Another object of the present invention is to provide a shipping container with cover members which lockably engaged and lockably disengaged by tapered hooks engaging into offset ends of the receptacle of the shipping container. The upper and lower cover members also have a rectangular right angular lip which frictionally secures over the rectangular receptacle and provides further strengthening of the shipping container.

A further object of the present invention is to provide a shipping container which provides a structure suitable for enclosure in a heat shrinkable plastic bag for shipping container. The plastic bag package provides an atmospheric container for inert gases such as nitrogen. The plastic bag package and simultaneously the container is purged with an inert gas such as nitrogen to provide an inert atmosphere for the substrate wafers. The plastic bag package also provides security and integrity of the semiconductor substrate wafers.

An additional object of the present invention is to provide a shipping container which provides additional room for automatic loading or unloading of the substrate wafers from the receptacle. Also, longitudinal ribs can be provided on the bottom of the receptacle box to maintain the substrate wafers in the receptacle box. Indexing holes can be provided in the bottom of the receptacle box when the receptacle box is positioned on an assembly line and indexed down the assembly line for processing.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein:

FIG. 4 illustrates another embodiment of a rectangular receptacle of the present invention;

FIG. 5 indicates an end view of a further embodiment of the present invention; and, FIG. 6 illustrates a top view, partially cutaway, of the further embodiment of the present invention.

DESCRIPTION OF THE PREFERRED EMBODIMENTS

Figure 1:
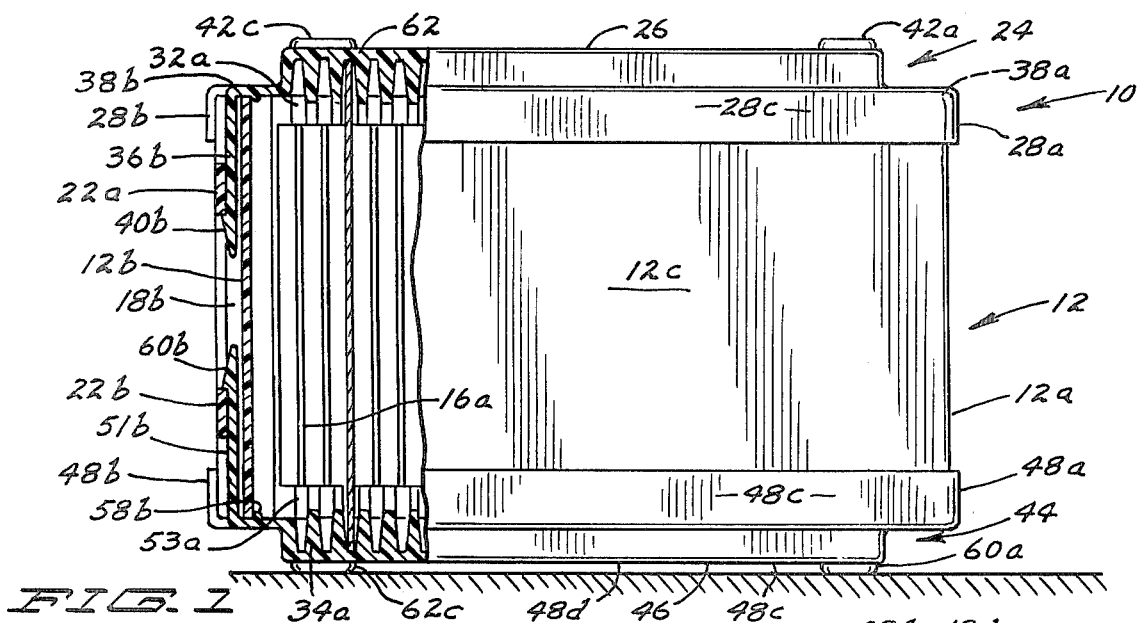
FIG. 1 illustrates a side elevational view partially cutaway, of the present invention, a shipping container for semiconductor substrate wafers.
Figure 2:
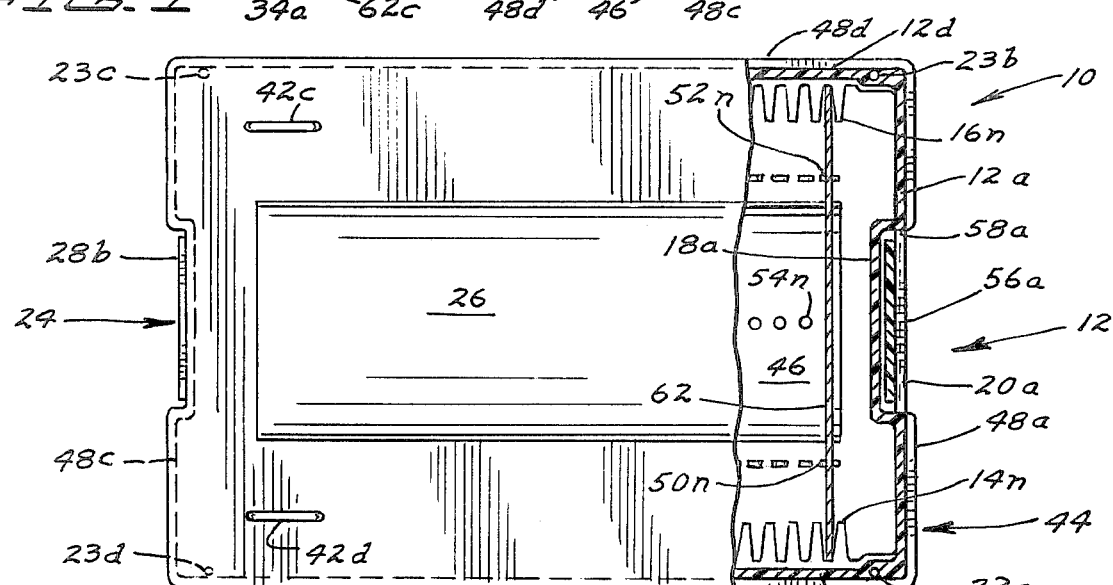
FIG. 2 illustrates a top plan view, partially cutaway, of the present invention.

FIG. 1, which illustrates a side elevational view, partially cutaway, of the present invention, a shipping container for semiconductor substrate wafers 10 such as silicon wafers and the like, shows an elongated rectangular receptacle 12 having four sidewalls including opposing ends 12a-12b and opposing sides 12c and 12d illustrated in FIG. 2. A plurality of outwardly extending opposing and aligned vertical ribs 14a-14n and 16a-16n which are equally spaced project outwardly from opposing sides 12c and 12d respectively thereby forming valleys between each of the respective ribs and peaks at the top of each of the ribs as also illustrated in FIG. 2. Offset vertical indentations 18a and 18b project into the opposing ends 12a and 12b respectively of the receptacle 12. Latch bars 20a and 20b and 22a and 22b extend horizontally between the offset indentations 18a and 18b, and are parallel to the upper and lower edges of the receptacle 12. Indexing holes 23a-23d as illustrated in FIG. 2 are provided at the four lower corners of the receptacle 12 for support and indexing semiconductor processing carrier machinery. Upper cover 24, identical in structure and physically interchangeable with lower cover 40, includes a longitudinal arcuate member 26 conforming to the diameter of the substrate wafers. Right angular lips 28a-28d extend from and around the longitudinal arcuate member 26 to frictionally secure against and with the sides and ends 12a-12d of the elongate receptacle 12 as illustrated in FIG. 2. A plurality of longitudinally spaced opposing fingers 30a-30n and 32a-32n are positioned along the longitudinal length of the arcuate member 26 and align with the respective valleys between each of the respective ribs 14a-14n and 16a-16n of the receptacle 12. A plurality of longitudinally spaced posts 34a-34n align on the lowest portion of the arcuate member 26, extend upwardly and outwardly perpendicular to the longitudinal arcuate member 26, and align with the peaks of the ribs 14a-14n and 16a-16n. Latches 36a and 36b extend upwardly and away from the lip members 38a and 38b on the cover 24. Outwardly extending tapered teeth 40a illustrated in FIG. 3 and 40b extend from the latch 36a and 36b to engage and lock with the latch bars 20a and 22a respectively. A plurality of low-profile rectangular feet 42a-42d are positioned about the four corners of the upper cover 24 as also illustrated in FIGS. 2 and 3.

The lower cover 44 is identical in structure and physically interchangeable with the upper cover 24. The lower cover 44 includes a longitudinal arcuate member 46, angular lips 48a-48d, opposing fingers 50a-50n and 52a-52n, plurality of posts 54a-54n, latches 56a and 56b extending from lip surfaces 58a-58b, tapered teeth 60a and 60b on the latches 56a and 56b, and the plurality of low-profile rectangular feet 62a-62d also illustrated in FIG. 3. A wafer 62 is supported in the shipping container as later described in detail.

FIG. 2, which illustrates a top plan view of the present invention, partially cutaway, shows the end 12a and the opposing sides 12c and 12d of the rectangular receptacle 12, the plurality of vertical opposing and aligned ribs 14 and 16, the offset portion 18a, the latch cross member 20a, the upper cover member 24 including the longitudinal arcuate member 26, the angular lips 28b-28d, the lower cover 44, the longitudinal arcuate member 46, the angular lips 48a, 48c, and 48d, the opposing fingers 50 and 52, the posts 54, the latch 56a extending from the lip surface 58a and having the tapered tooth 60a not illustrated in the figure. A wafer 62 is supported in the shipping container as later described in detail.

Figure 3:
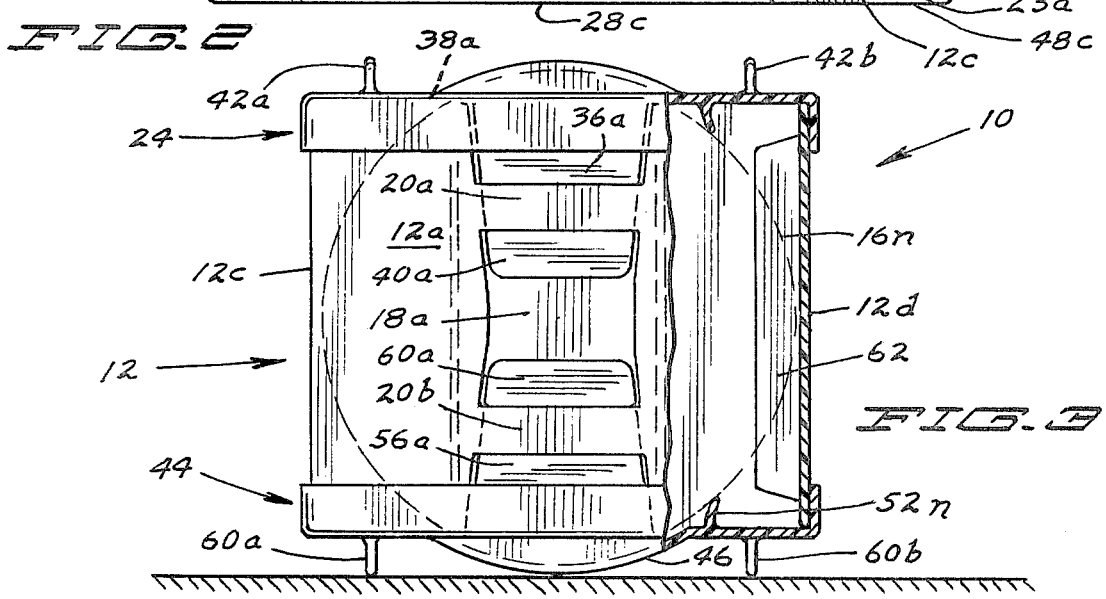
FIG. 3 indicates an end elevational view, partially cutaway, of the present invention.

FIG. 3, which illustrates an end elevational view of the present invention, partially cutaway, shows the sides 12a, 12c and 12d, a rib 16, the offset portion 18a, the latching bars cross members 20a and 20b, the upper cover 24 and the lower cover 44. The latches 36a and 56a include the tapered teeth 40a and 60a which extend over the latching bar cross members 20a and 20b with the tapered teeth 40a and 56a in a hooking manner respectively. The wafer 62 is positioned in the shipping container 10 respectively.

FIG. 4, which illustrates a detailed transverse cross section of another embodiment of the present invention, shows the elongated rectangular receptacle, a pair of longitudinal ribs 70a and 70b extending the entire length of the elongated receptacle 12 between the opposing ends 12a and 12b and parallel to the opposing sides 12c and 12d of the receptacle 12. When the lower cover member 44 engages with the elongated rectangular receptacle 12, the fingers project over and above the longitudinal ribs 70a and 70b. All other numerals correspond to those elements previously described.

FIG. 5, which illustrates a further embodiment of the present invention, shows a shipping container 80 for semiconductor substrate wafers such as silicon wafers and the like including an elongated receptacle 82 having opposing ends 82a and 82b and opposing sides 82c and 82d as also illustrated in FIG. 6. A plurality of opposing and aligned spaced longitudinal vertical ribs 84a-84n and 86a-86n extending orthogonally to the elongated longitudinal opposing sides 82c and 82d project outwardly from the opposing sides 82c and 82d forming valleys on the sides 72d between the respective ribs on each side and forming peaks at the top of each of the respective ribs as illustrated in FIG. 6. An upper cover 88 and a lower cover 90 frictionally engage with the sides and ends of the receptacle 82. The covers 88 and 90 are physically identical and physically interchangeable with each other. The upper cover 88 includes a longitudinal arcuate member 88a, a channel member 88b affixed to and extending the circumference of the arcuate member 88a which engages with the respective sides of the receptacle, and longitudinal extending ribs 88c and 88d which provide for resting of the container on a surface, and also provide longitudinal and transverse strength for the shipping container 80. An equal plurality of ribs 92a-92n extend outwardly from the concave portion of the longitudinal arcuate member 46 and are in alignment with the ribs 84a-84n and 86a-86n of the rectangular receptacle 82. The ribs 92a-92n have a curvature corresponding to the curvature of the longitudinal arcuate member 88a. The lower cover 90 includes like elements of a longitudinal arcuate member 90a, a channel member 90b, longitudinal ribs 90c and 90d, and an equal plurality of ribs 94a-94n having curvature corresponding to the curvature of the rib members 92a-92n. The ribs 92 and 94 of the upper and lower covers 88 and 90 respectively form peaks and valleys corresponding to the peaks and valleys of the ribs 84a-84n and 86a-86n of the receptacle 82. A plurality of teats 96a-96h project outwardly on the receptacle 80 to engage with corresponding indentations 98a-98h in the channels 88 and 90 respectively as illustrated.

FIG. 6, which illustrates a top view, partially cutaway of the further embodiment of the present invention, shows the rectangular receptacle 80, and the interchangeable upper cover 88 and the lower cover 90. The elements correspond to those elements previously delineated. Holes 102a-102d illustrated in dashed lines extend into the bottom and partially up through the support posts 104a-104d which accept pins of a semiconductor indexing processing carrier.

PREFERRED MODE OF OPERATION

Referencing FIGS. 1-3, the receptacle 12, the upper cover 24 and the lower cover 44, both covers being physically interchangeable with each other, are cleaned prior to utilization such as in a detergent solution and subsequently dried with dust-free air. One of the covers, such as lower cover 44, is positioned and latched onto the receptacle as best illustrated in FIG. 3 where the angular lips 48a-48d of the cover 44 engage against the sides 12a-12d of the receptacle 12 and the latches 56a and 56b including the tapered teeth 60a and 60b engage with the crossbars 20b and 22b thereby locking the lower cover 44 firmly into position over the sides 12a-12d of the receptacle 12. Subsequently, a plurality of semiconductor substrate wafers 62a-62n having a diameter equal to the width between the sides 12a and 12d of the receptacle 12 are positioned in the receptacle 12 where the lower circumferential portions of the wafer rest on opposing aligned fingers 50 and 52. The fingers 50 and 52 provide cushioning and support while the valleys between the ribs 14 and 16 provide guidance and support to the middle portion of the substrate wafer during insertion and subsequently in a supportive position. The posts 54 further provide separation between the substrate wafers 62 during insertion of the substrate wafers 62 into the receptacle 12 and prior to coming to rest on the fingers 50 and 52. Once the substrate wafers 62 are inserted into the receptacle 12 and lower cover 44, the upper cover 24 is positioned onto the receptacle 12 and locked to the receptacle 12 as previously described for the lower cover 44 where the angular lips 28a-28d engage against the sides 12a-12d of the receptacle 12 and the latches 36a and 36b having the tapered teeth 40a and 40b engage over the latch crossbars 20a and 22a. Likewise, the fingers 30 and 32 of the upper cover 24 come into contact at the upper circumferential portions of the wafers 62 and provide support in combination with the lower fingers 50 and 52. Subsequently, the shipping container 10 can be packaged in a heat shrinkable plastic bag not illustrated in the figures and purged with an inert gas such as nitrogen preventing against environmental contamination.

FIG. 4 illustrates another embodiment of the present invention where the receptacle 12 is provided with longitudinal ribs 70a and 70b so that when the lower cover 44 is removed from the receptacle 12, the longitudinal ribs 70a and 70b provide support to the wafers 62 and the receptacle 12 can subsequently be positioned on pins of a process carrier with the longitudinal ribs 70a and 70b still supporting the wafer 62. The longitudinal ribs 70a and 70b provide support only during the period when the lower cover 44 is removed.

FIGS. 5 and 6 illustrate the further embodiment 80 of a shipping container which differs from the shipping container of FIGS. 1-3 in that the upper and lower covers are provided with the plurality of ribs 92 and 94 spaced along the longitudinal arcuate members 88a and 90a which provide circumferential support over an angular portion of the substrate wafers 106. Each of the upper and lower valleys between the ribs provides support over an angular portion on the circumferences of the substrate wafers 106 of the longitudinal arcuate members 88a and 90a.

The shipping containers 10 and 80 can be molded from any suitable material such as resiliently yieldable plastic polyethylene material.

Various modifications can be made to the shipping containers of the present invention without departing from the apparent scope thereof.

Having thus described the invention, what is claimed is:

1. A shipping container for silicon semiconductor wafer substrates and the like, comprising a rectangular receptacle of resiliently yieldable plastic material having four adjoining sides and open top and bottom ends opposite each other, each side of the receptacle comprising an upright wall formed integrally and in one piece with the adjoining walls of adjacent sides, a first pair of said walls being disposed opposite to each other and having a multiplicity of upright ribs on the interior surfaces thereof and spaced regularly from each other for confining such substrates there between, a pair of top and bottom covers traversing said open ends and attached to the receptacle, said covers being entirely removable and completely detached from the receptacle walls, and having a substrate-engaging means on the inner surfaces of the covers for engaging and retaining the substrates in the container, and each of the covers having a peripheral lip embracing the end of the receptacle side walls in closely fitting relation.

2. The invention according to claim 1 and detente means securing the covers onto the receptacle.

3. Shipping container of claim 1 wherein said support means comprises:
   a. plurality of outwardly extending opposing and aligned vertical ribs projecting from opposing elongated parallel sides of said receptacle, and;
   b. plurality of upwardly extending vertical ribs positioned and aligned on each of said covers with respect to the peaks formed between each of said ribs of said receptacle whereby said ribs separate said wafers from each other.

4. Shipping container of claim 1 further comprising:
   a. plurality of teats positioned about the sides of said receptacle, and;
   b. plurality of indentations positioned in said angular lip and aligned with said teats on said receptacle whereby said teats engage in said indentations to lockably engage said cover to said receptacle.

* * * * *